TELEVISION TUNING MECHANISM

Filed Oct. 12, 1967 2 Sheets-Sheet 1

Inventors
George R. Dickinson
Eugene J. Polley
By Francis W. Crotty
Attorney

Inventors
George R. Dickinson
Eugene J. Polley
By Francis W. Crotty
Attorney 3,492,608
TELEVISION TUNING MECHANISM George R. Dickinson, Norridge, and Eugene J. Polley, Lombard, Ill., assignors to Zenith Radio Corporation, Chicago, Ill., a corporation of Delaware Filed Oct. 12, 1967, Ser. No. 674,961
Int. Cl. H03j *3/20*
U.S. Cl. 334—82 6 Claims

ABSTRACT OF THE DISCLOSURE

A UHF television tuner has a series of tuning capacitors the rotors of which are mounted on a shaft and are capable of continuous tuning over the entire UHF band. A detent presets the shaft to particular UHF channels and fine tuning is accomplished by selectively rotating what are normally the stator elements of the tuning capacitors, their adjustment being brought about by rotational displacement of the tuner housing about the shaft of the rotor electrodes of the tuning capacitors.

BACKGROUND OF INVENTION

The commercially allocated television channels are currently disposed in a VHF and UHF band, the former accommodating channels 2–13 and the latter providing for channels 14–83. There is a very significant gap or frequency separation of these two bands which complicates the problem of preset tuning especially in view of the requirements of the Federal Communications Commission that the television receiver be capable of accepting or responding to the broadcast of any channel in either band.

The approach to this problem has, for the most part, been the adoption of two tuning mechanisms, one for each of the frequency separated bands. Since the VHF band has a relatively small number of channels, it is easily accommodated by a turret tuner which has distinct advantages with respect to accurate or precise preset tuning. The number of channels in the UHF band, however, preclude any such turret mechanism. Generally, use is made of frequency selectors having a tunable element, such as a variable air dielectric capacitor, for continuous tuning adjustment over the entire UHF range in less than a complete revolution of a tuning shaft to which the capacitor rotors are secured.

Functionally, such a structure, in conjunction with a VHF turret, is perfectly capable of meeting the requirements of the Federal Communications Commission and of providing acceptable selectivity for channels in the UHF band. It has the difficulty, however, of being sensitive to adjustment in that a small angular displacement of the tuning rotor must cover a substantial segment of the UHF spectrum. This causes the tuning characteristic to be highly selective, requiring careful adjustment on the part of the user to tune to a particular UHF channel. It is for this reason that preset is a most desirable feature of a UHF tuner since it makes tuning easier for the user. Accordingly, a number of preset mechanisms have been proposed but they have serious problems of reset accuracy. It has been necessary heretofore to adopt complex and costly mechanical arrangements to assure precision tuning for each operating position of the preset mechanism.

SUMMARY OF THE INVENTION

Accordingly, it is an object of the invention to provide an improved mechanism for selectively tuning a television receiver to any of a group of signal channels within a predetermined range of frequencies, such as the UHF band.

It is another and specific object of the invention to provide a mechanism that is continuously adjustable over the UHF television band and also has a preset feature with a novel fine tuning adjustment.

A mechanism in accordance with the invention for selectively tuning a television receiver to any of a group of signal channels within a predetermined frequency range, such as the UHF band, comprises a plurality of similar selectors individually including a first member and a second member collectively defining a variable impedance having a value determined by their relative positions. There are means for supporting the first members of the selectors for simultaneous displacement, relative to their second members, to tune the selectors concurrently over frequency ranges related to the aforesaid predetermined range. A first tuning means is provided for selectively moving the first-mentioned support means to displace the first members to predetermined positions within their displacement range to tune the selectors to selected portions of their respective frequency ranges. This position, once established, is retained by means for releasably locking the first members in their predetermined positions. There are other means for supporting the other or second members of the selectors for simultaneous displacement, relative to their respective first members, over a displacement range that is small compared with the displacement range of the first members. Finally, there is a second tuning means for selectively moving the support of the second members for fine tuning of the selectors to a chosen one of the signal channels.

More specifically, the selectors may be tunable by capacitors which have the usual rotor and stator electrodes. A first tuning shaft supports the rotors for displacement over a range that tunes throughout the entire UHF band. The stators are supported on a frame or housing and it, in turn, is rotatably supported by the rotor shaft. The fine tuning control is a cam or other mechanical system for selectively rotating the housing, and along with it the stators of the tuning capacitors, over a very small range for fine tuning purposes.

BRIEF DESCRIPTION OF DRAWING

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF PREFERRED EMBODIMENTS

The nature of the tunable circuits is of no particular moment to the present invention which is generally useful in tuning to UHF channels through the control of selector circuits which individually have first and second members physically adjustable relative to one another to determine the instantaneous condition of tuning. In the usual case, each such selector has an inductive reactance and a capacitive reactance, one of which has an adjustable effective impedance determining the condition of tuning. Structurally, a most convenient form of selector has a variable capacitive reactance of the ganged air-dielectric variety comprising two or more capacitors each of which has a stator electrode and one or more rotor electrodes. All of the rotors are supported on a common tuning shaft and are displaceable relative to their stators for tuning. Each angular position of the rotors establishes a particular condition of tuning of the selectors.

Figure 1:
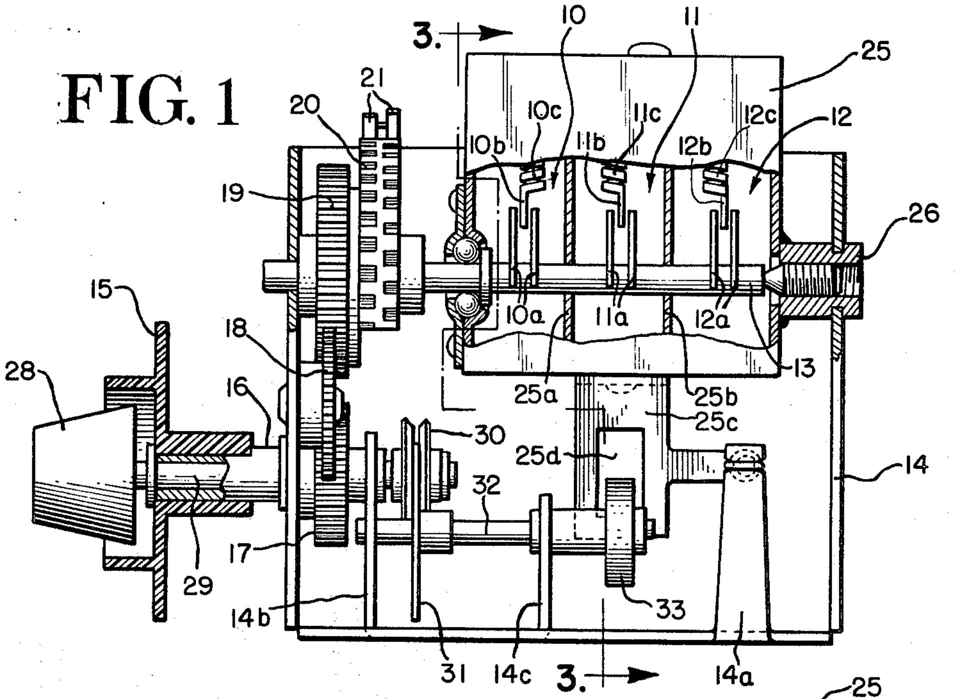
FIGURE 1 is an elevational view of a UHF tuner embodying the invention.

Such an arrangement has, for convenience, been illustrated in FIGURE 1. The illustration has been confined to the tuning mechanism and only so much of the selectors themselves as necessary to make clear the coupling of the mechanism to the selectors and their controlled tuning made possible by that mechanism. The circuitry of which the selectors may be part is of no particular concern to the invention but, for convenient reference, a desirable form of electrical system including selectors of the type indicated in the figure in question is the subject of a copending application, Ser. No. 343,278, filed Feb. 7, 1964, in the name of Wayne H. Reynolds and assigned to the assignee of this invention.

For the embodiment under consideration, the tuning mechanism has three similar selectors 10, 11 and 12 individually including a two-part first member or rotor 10*a*, 11*a*, 12*a* and a second member or stator 10*b*, 11*b*, 12*b*. Each stator electrode is a planar extension of one of the coils 10*c*, 11*c*, 12*c* and collectively each subcombination of coil, stator and rotor defines a tunable selector having a variable impedance, specifically a capacitance, exhibiting a value determined by the relative positions of its rotor and stator electrodes.

Accordingly, there are means for supporting the rotors for simultaneous displacement relative to their respective stators to tune the selectors concurrently over frequency ranges related to the UHF band. More particularly, the rotors are mounted on and supported by a shaft 13 which in turn is supported by a frame 14 for rotation. Any suitable bearing structures may be employed to couple shaft 13 to frame 14 while permitting its rotation. The details of the bearing arrangement are of no particular consequence. Additionally, there is a first tuning means for moving shaft 13 to displace the rotor electrodes to predetermined positions within their displacement range to tune the selectors simultaneously to selected portions of their respective frequency ranges. As illustrated, this first tuning means comprises a selector knob 15 mechanically coupled to a shaft 16 which carries a driving gear 17 mechanically coupled through an intermediate gear 18 to a driven gear 19 secured to rotor shaft 13. Adjustment of knob 15 permits tuning each selector to a preselected channel and also permits tuning over the entire UHF band.

A word is in order concerning the frequency ranges of selectors 10, 11 and 12. If it be assumed that selectors 10 and 11 are portions of the input and first detector stages of a superheterodyne type of receiver, they are arranged to tune over the UHF band. If selector 12 be considered the frequency-determining portion of the heterodyning oscillator, it is tuned over a band of equal width but frequency displaced therefrom so that the output of the first detector is a signal of a fixed and predetermined intermediate frequency. This, of course, presupposes that the selectors track accurately over the entire tuning range.

It is convenient to introduce preset tuning, that is to say, a feature by which shaft 13 may be driven to predetermined angular positions corresponding to desired channel selection. For this purpose shaft 13 carries a detent wheel 20 with a detent spring 21 releasably engaging the wheel to arrest or lock the shaft in preset angular positions. Obviously, a single detent wheel may be used but when it is necessary to accommodate as many channels as are found in the UHF band with slightly over 180° displacement of shaft 13, it is more convenient to construct the detent wheel to have a pair of similar gear surfaces each displaced one-half pitch distance relative to the other. The detent 20, as shown, has two gear sectors, and spring 21 likewise has two parts each aligned with an assigned one of the gear sectors. The frequency separation represented by successive detent positions is determined by the tuning characteristics of the selectors and also the channels for which a detent position is desired. In the ultimate, there is a detent position for every available channel in the UHF band but this, of course, is not a necessary restriction on the invention; a lesser number of preset positions may be made available if that should be desirable. Moreover, it is desirable that the selectors exhibit a linear tuning characteristic by which is meant a given angular displacement of shaft 13 causes a given incremental change in tuning frequency. Where the tuning characteristic is linear and the detent accommodates all channels in the range, the separation between successive detent positions corresponds to the inter-channel separation in the range. This, of course, is predicated on the fact that the UHF channels are themselves uniformly spaced in the UHF band.

While preset is certainly desirable, a fine tuning arrangement is included in the mechanism so that precision tuning is readily attainable with a structure that is both simple and inexpensive. To that end, the stator electrodes are likewise supported for simultaneous rotational displacement relative to their respective rotors over a displacement range that is but a small fraction of the displacement range of the rotors. More specifically, each of coils 10*c*, 11*c* and 12*c* is secured at one end to a shield housing 25 one side wall of which has a bearing support from shaft 13. The opposite side wall may likewise be supported from shaft 13 or from its bearing 26 as shown in FIGURE 1 in which case the bearing itself is rotatable within a principal support frame 14 of the tuning mechanism. There are intermediate partitions 25*a* and 25*b* which divide housing 25 into three compartments for individually housing and shielding the three selectors as described in the Reynolds application. A spring 27 is secured at one end to a portion 14*a* of the frame and at the other to a tongue 25*c* depending from shield housing 25. This spring urges the hiusing in a counterclockwise direction about shaft 13 as viewed in FIGURE 3.

There is a second tuning means for selectively moving shield housing 25 and, along with it, the stator electrodes for fine tuning of the selectors to a selected one of the variable UHF signal channels. As shown, this comprises a fine tuning knob 28 secured to a shaft 29 which is concentric within shaft 16 and rotatable relative thereto. Shaft 29 carries a friction gear 30 for engaging a disk 31 carried by a cam shaft 32 rotatably supported by portions 14*b*, 14*c* of frame 14. A cam 33 is secured to shaft 32 in alignment with tongue 25*c* to be engaged thereby as a cam follower. The throw of cam 32 from its small-radius to its large-radius sections determines the displacement range of shield housing 35 under the influence of this cam and its effect in displacing the shield by contacting cam follower 25*c*.

Figures 2, 3:
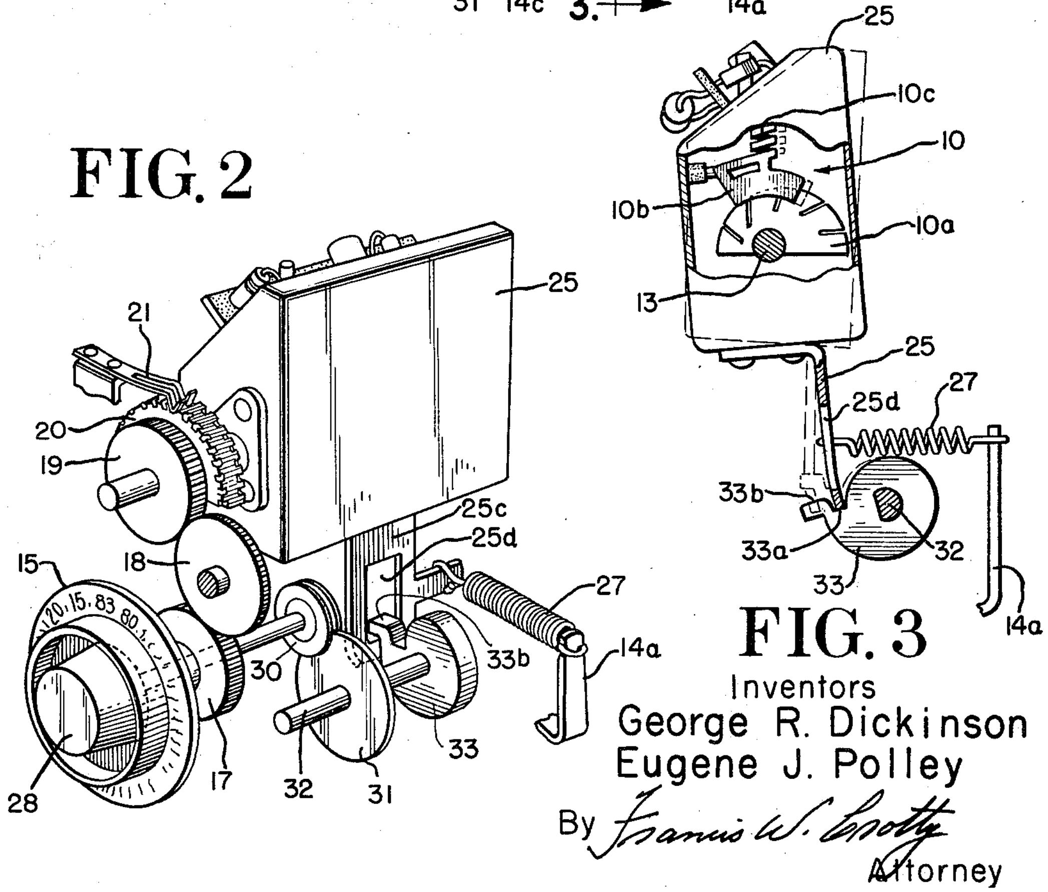
FIGURE 2 is a perspective view showing the detent and drive arrangement of the tuner of FIGURE 1.
FIGURE 3 is a view taken as indicated by section lines 3—3 of FIGURE 1.

If tongue 25*c* has a slot 25*d* milled therein as shown in FIGURES 1 and 3, it may also serve as a stop element for cam 33, engaging cam segment 33*a* at one extreme position of displacement of the shield housing and engaging cam portion 33*b* at the other extreme position of displacement. Since tongue 25*c* may serve to limit the rotation of cam 33, the drive afforded by friction elements 30, 31 permits continued rotation of fine tuning knob 28 even though the extremes of cam rotation and shield displacement have been reached. To facilitate use of the described mechanism, it is convenient to inscribe a channel scale on the flange of channel selector knob 15 as indicated in FIGURE 2.

In operation, channel-selection knob 15 is rotated so that any particular channel may be selected, assuming for convenience that its selection is designated when its identifying numeral is presented vertically on the scale of knob 15. This position of the knob corresponds to a detent position of shaft 13 and also to the establishment of the rotor electrodes of each of the selectors to a corresponding position in their respective displacement ranges. This tunes each selector at least approximately to the selected channel and fine tuning, should that be necessary, is easily accomplished by rotation of fine tuning knob 28. Rotation of that knob may displace shield housing 25 between the full-line and broken-line extreme positions indicated in FIGURE 3. It is convenient that this displacement range of the stator electrodes represent at least the interchannel frequency separation in the UHF band, assuring an adequate range of the fine tuning control. It is apparent that channel selector knob 15 permits the user to displace the rotors over their entire range and therefore may tune the receiver incorporating such a mechanism over the complete UHF spectrum. As described, the mechanism also permits preset selection of any channel in that range although it is entirely feasible to restrict the preselect feature to ten or fewer channels because seldom are that many channels available in any given geographical area. To adjust for preset selection of less than all channels merely requires that the detent provisions of gap 21 correspond in number and in rotor position to the channels available in the particular location of interest.

Figure 4:
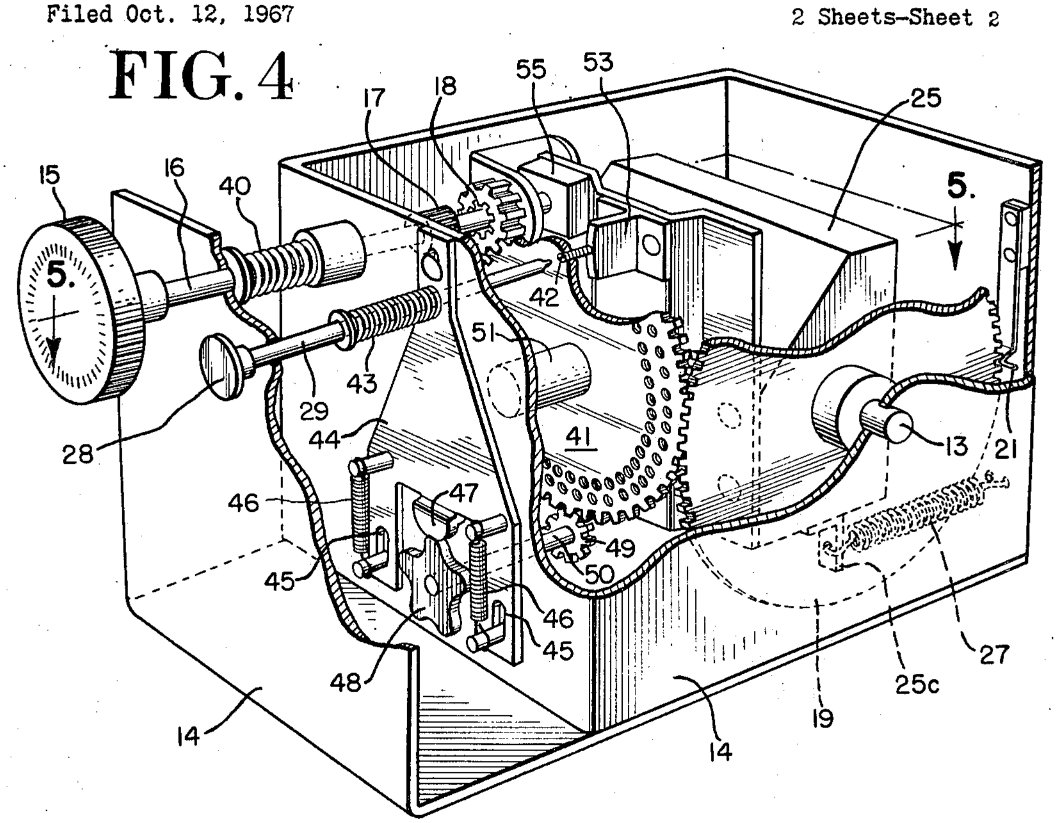
FIGURE 4 is a perspective view, partially broken away, of another embodiment of the invention.
Figure 5:
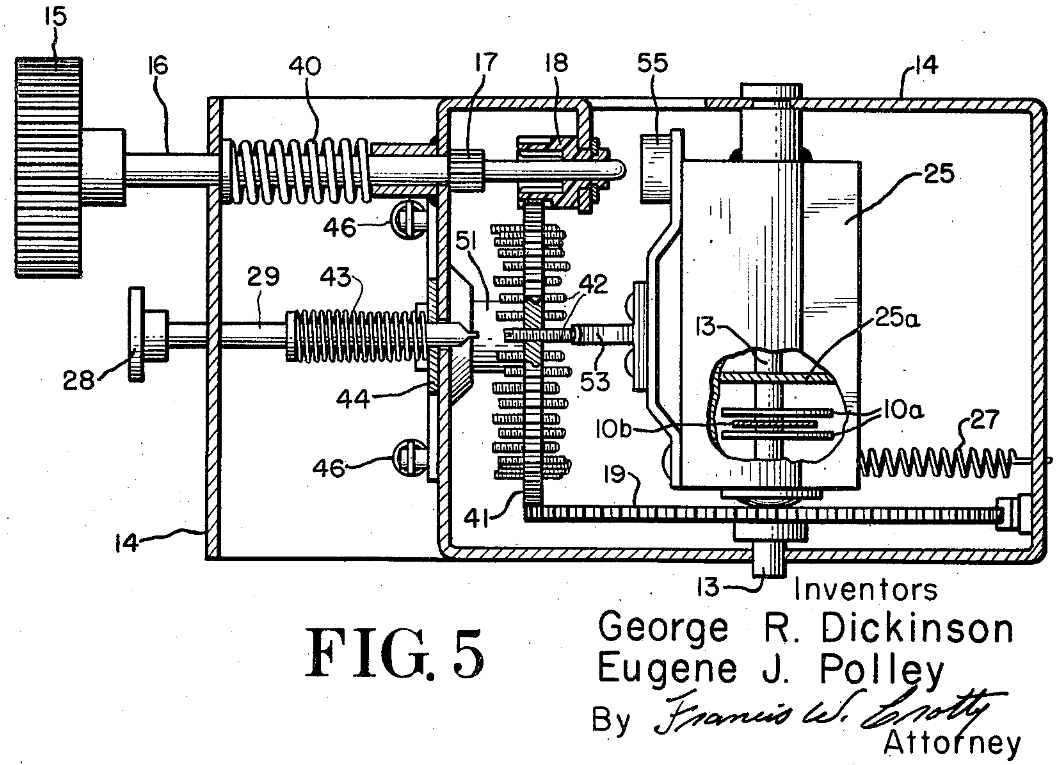
FIGURE 5 is a view taken along section lines 5—5 of FIGURE 4.

A generally similar but structurally different embodiment of the invention is disclosed in FIGURES 4 and 5. A principal difference in the two is that fine tuning for any selected UHF channel in the arrangement of FIGURE 1 is determined by the instantaneous angular position of cam 33 which is effective for all channels, whereas in the alternative structure there are individual fine tuning adjustments for the UHF channels as presently to be described.

In this arrangement, intermediate gear 18 has both internal and external teeth, the former being dimensioned to accept and mechanically couple to driving gear 17 which is secured to and rotatable with tuning shaft 16. A spring 40 biases shaft 16 to the position illustrated in FIGURE 5 wherein gears 17 and 18 are disengaged although the force of the spring may be overcome and shaft 16 advanced to the right to bring these gears into driving engagement with one another.

The connection from the external teeth of intermediate gear 18 to driven gear 19 is through a gear 41 which, in addition to completing the driving system to rotor shaft 13 also supports a series of vernier or fine tuning elements 42. These elements are very similar to machine screws and their lengths determine the range of vernier or fine tuning adjustment available since the elements thread into gear 41. Because of the large number of channels in the UHF band it is convenient to arrange vernier elements 42 in two concentric rows as indicated in FIGURE 4. The adjustment of each such element is under the control of fine tuning knob 28 carried on shaft 29 which also is biased to the position shown in FIGURE 5 by means of a compression spring 43. Shaft 29 has a screwdriver type termination and may be advanced to the right to engage the slotted head of the vernier element that is instantaneously in axial alignment with the fine tuning shaft. Obviously, this shaft is rotatable with respect to its biasing spring 43.

It will be observed in FIGURE 4 that vernier shaft 29 extends through a plate 44 which is supported from a vertical panel of frame 14 through pins or screws extending through slots 45 of the plate. The pin and slot connection permits limited vertical displacement of plate 44 as required to displace the tool termination of shaft 29 from one row to the other of vernier elements 42. Springs 46 bias plate 44 downwardly so that a cam following projection 47 thereof is retained in cam following engagement with a star wheel 48. As wheel 48 is moved in step by step fashion follower 47 and the biasing springs 46 cause the tool termination of shaft 29 to move selectively back and forth between the two rows of vernier elements 42. The star wheel moves in appropriate timed relation to gear 41 since it is driven therefrom through a gear 49 secured to shaft 50 which also supports wheel 48. Any conventional bearing arrangement may be provided to rotatably support shaft 50 from frame 14 of the tuner. This detail does not appear in the drawing. Of course, it is essential that gear 41 be rotatably supported and that is accomplished by a shaft 51.

In the embodiment under consideration, there is no separate detent gear. Instead, spring 21 engages driven gear 19 and they collectively supply the detent function.

In this embodiment of the invention, the mechanical portions normally have the position illustrated in which both tuning shafts 16 and 29 are displaced by their springs 40, 43 to be out of engagement with those components to which they couple during tuning. Spring 27, which lishes a particular angular orientation of stator housing 53 to rest against the instantaneously effective vernier element 42 as illustrated in FIGURE 5. In this condition of the apparatus, the gear train leading to driven gear 19 has established rotors 10 of the selectors in a predetermined angular position which achieves at least approximate selection of a given UHF channel. At the same time, engagement of detent 53 against vernier element 42 establishes a particular angular orientation of stator housing 25 about rotor shaft 13 and accomplishes fine or vernier tuning to the UHF channel that has been selected.

When it is desired to tune to a different channel, channel selector knob 15 is grasped and shaft 16 is displaced to the right. In its travel, it encounters a block 55 affixed to housing 25 to the end that as shaft 16 is fully displaced, engaging driving gear 17 with the internal teeth of gear 18, housing 25 shall have been rotated in a clockwise direction against the urging of spring 27 to remove detent 53 out of the path of movement of all vernier elements 42. In this condition of the mechanism, the user is free to rotate channel selector 16 and establish rotor shaft 13 in any of its multiplicity of preset angular positions as required to select any of the available UHF channels. During rotation of shaft 16 as required to make the channel selection, gears 41 and 49 effect step by step rotation of star wheel 48 so that the tool termination of vernier shaft 29 remains properly aligned with the relevent vernier element 42 necessary for fine tuning of whatever channel may be selected.

When a particular channel position is attained, selector knob 15 is released and shaft 16 is restored to its rest position under the influence of spring 40. As shaft 16 returns to its rest position, spring 27 is permitted to displace housing 25 in a counterclockwise direction until such time as detent 53 engages the instantaneously effective vernier element 42. If that element has previously been properly positioned, no adjustment of fine tuning knob 28 is required. Otherwise, knob 28 may be grasped to advance the tool termination of shaft 29 into engagement with the vernier element 42. Thereafter, rotation of the shaft permits precise fine tuning. Obviously, the vernier element 42 may be advanced or retracted depending on the direction of rotation of fine tuning shaft 29.

Both described arrangements permit preset tuning of channels in the UHF band. Both the arrangements are relatively simple structures and are easily tunable.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A mechanism for selectively tuning a wave signal receiver, such as a UHF television receiver, to any of a group of signal channels within a predetermined range of frequencies comprising:

a plurality of similar selectors individually including a first member and a second member collectively defining a variable impedance having a value determined by their relative positions;

means for supporting said first members of said selectors for simultaneous displacement, relative to their respective second members, to tune said selectors concurrently over frequency ranges related to said predetermined range;

first tuning means for selectively moving said support means to displace said first members to predetermined positions within their displacement range to tune said selectors to a selected portion of their respective frequency ranges;

means for releasably locking said first members in said predetermined positions;

housing means for enclosing said selectors and for supporting said second members of said selectors for simultaneous displacement, relative to their respective first members, over a displacement range that is but a small fraction of the displacement range of said first members;

and second tuning means for selectively moving said housing and support means for fine tuning of said selectors to a selected one of said signal channels.

2. A tuning mechanism in accordance with claim 1 in which said first tuning means approximately tunes said selectors to a selected one of said signal channels.

3. A tuning mechanism in accordance with claim 1 in which the displacement range of said second members corresponds approximately to the frequency separation between successive predetermined positions of said first members within their displacement range.

4. A tuning mechanism in accordance with claim 1 in which said first and second members of said selectors are rotor and stator elements respectively of a tuning capacitor, in which said rotors are supported on a common shaft, and in which said housing and support means is supported by and rotationally displaceable with respect to said common shaft.

5. A tuning mechanism in accordance with claim 4 in which said housing and support means is biased to a predetermined angular position about said common shaft and in which said second tuning means comprises a displaceable cam in engagement with said housing and support means for displacing said housing and support means in a predetermined angular position in response to displacement of said cam.

6. A tuning mechanism in accordance with claim 5 in which the maximum displacement of said shaft by said cam represents a frequency change in the tuning of said selectors that is substantially equal to the adjacent channel separation of said group of signal channels.

References Cited

UNITED STATES PATENTS

| | | | |
|---|---|---|---|
| 2,598,810 | 6/1952 | Lyman | 334—75 |
| 2,980,797 | 4/1961 | Million | 334—76 X |
| 1,904,165 | 4/1933 | Mullner | 334—79 XR |
| 2,471,523 | 5/1949 | Gusdorf et al. | 334—52 |
| 2,808,515 | 10/1957 | Nestlerode et al. | 334—51 |
| 3,411,367 | 11/1968 | Massa et al. | 334—51 XR |

HERMAN KARL SAALBACH, Primary Examiner

MARVIN NUSSBAUM, Assistant Examiner

U.S. Cl. X.R.

334—83, 84, 85